(12) United States Patent
Griffith et al.

(10) Patent No.: US 6,552,617 B1
(45) Date of Patent: Apr. 22, 2003

(54) DUAL-TUNE INPUT INTEGRATED VCO ON A CHIP

(75) Inventors: Scott A. Griffith, San Clemente, CA (US); Pete Good, Dana Point, CA (US); John S. Walley, Portola Hills, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/706,921

(22) Filed: Nov. 6, 2000

(51) Int. Cl.[7] .................................................. H03L 7/12
(52) U.S. Cl. ........................... 331/10; 331/25; 331/1 A; 455/260; 327/156; 327/157
(58) Field of Search ............................ 331/10, 25, 1 A; 455/260, 264, 265; 327/156, 157, 159

(56) References Cited

U.S. PATENT DOCUMENTS 3,579,281 A * 5/1971 Kam ........................ 331/177 V
4,272,729 A * 6/1981 Riley, Jr. ...................... 331/1 A

* cited by examiner

Primary Examiner—Arnold Kinkead
(74) Attorney, Agent, or Firm—Mintz Levin Cohn Ferris Glovsky and Popeo PC

(57) ABSTRACT

A system for controlling an output frequency of a dual-input voltage controlled oscillator relative to a reference frequency is provided. The method includes the step of coupling a first tune control signal to a first input of the dual-input voltage controlled oscillator. The method further includes the steps of dividing the output frequency of the dual-input voltage controlled oscillator by a value substantially equal to a second tune control signal, comparing a phase of the divided output frequency with a phase of the reference frequency and coupling a phase difference of the compared phases to a second input of the dual-input voltage controlled oscillator.

31 Claims, 2 Drawing Sheets

DUAL-TUNE INPUT INTEGRATED VCO ON A CHIP

BACKGROUND OF THE INVENTION

1. Field of the Invention

The field of the invention relates to oscillators and more particularly to voltage controlled oscillators.

2. Related Art

Voltage controlled oscillators (VCOs) are typically used in radio frequency transceivers as a mechanism for upconverting an information signal from baseband to a particular transmission frequency (i.e., channel) or for downconverting an information signal from a particular transmission channel to baseband. VCOs typically use tank circuits and operates under the influence of a variable capacitance provided by a varactor. Tank circuits are devices that resonate at frequencies determined by inductive and capacitive elements. Changing the values of the inductive or capacitive elements changes the resonant frequency of the tank circuit, thus changing the output frequency of a VCO relying upon the tank circuit.

The varactor of a VCO may be a diode or some other similar device. As is known, the capacitance across some diodes changes as a function of a reverse-bias voltage. Where the reverse-biased diode is coupled to an inductor, the resonant frequency of the tank circuit formed thereby can be independently controlled by the voltage across the diode.

While VCOs are effective, low voltage VCO designs, relying upon on-chip varactor diodes, typically suffer from performance impediments such as frequency centering errors and large variations in tuning constants. Frequency centering errors can be reduced by providing a large tuning sensitivity range, but this can contribute to phase noise. Because of the importance of VCOs in communications, a need exists for a better method of improving the tuning linearity and centering frequency error of VCOs.

SUMMARY

A system is provided for controlling an output frequency of a dual-input voltage controlled oscillator relative to a reference frequency.

The method includes the step of coupling a first tune control signal to a first input of the dual-input voltage controlled oscillator. The method further includes the steps of dividing the output frequency of the dual-input voltage controlled oscillator by a value substantially equal to a second tune control signal, comparing a phase of the divided output frequency with a phase of the reference frequency and coupling a phase difference of the compared phases to a second input of the dual-input voltage controlled oscillator.

The apparatus includes a first tune control signal coupled to a first input of the dual-input voltage controlled oscillator and a frequency divider adapter to divide the output frequency of the dual-voltage controlled oscillator by a value substantially equal to a second tune control signal. The apparatus also includes a comparator adapted to compare a phase of the divided output frequency with a phase of the reference frequency and a phase detector adapted to couple a phase difference of the compared phases to a second input of the dual-input voltage controlled oscillator.

Other systems, methods, features and advantages of the invention will be or will become apparent to one of skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. Moreover, in the figures, like reference numerals designate corresponding parts throughout the different views.

DETAILED DESCRIPTION OF A PREFERRED EMBODIMENT

Figure 1:
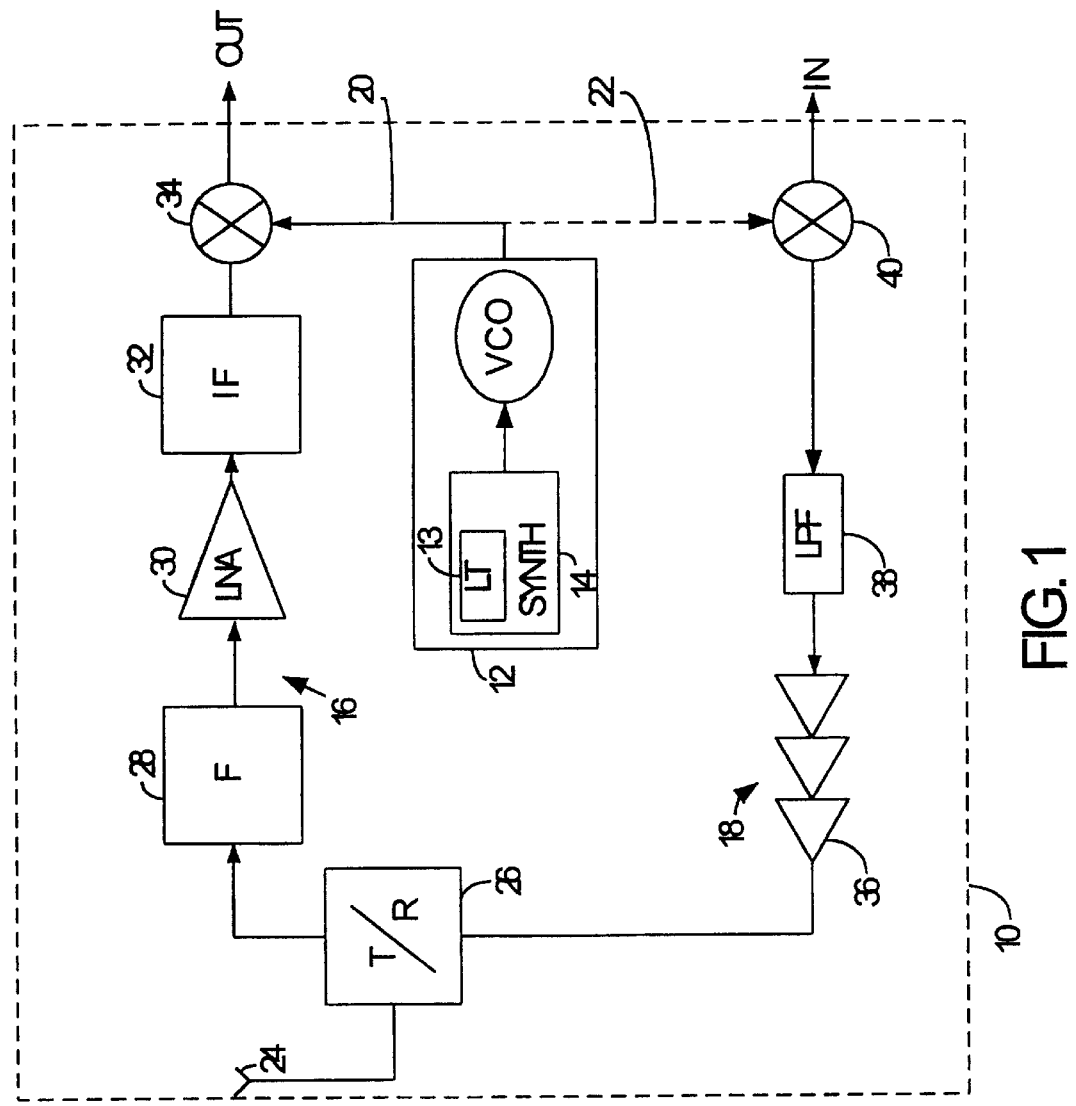
FIG. 1 is a block diagram of a voltage controlled oscillator shown in a context of use under an illustrated embodiment of the invention.

FIG. 1 shows a dual input voltage controlled oscillator (VCO) system 12 in a context of use under an illustrated embodiment of the invention. As shown, the VCO system 12 is depicted within a simplified radio frequency (rf) transceiver 10. Within the rf transceiver 10 the VCO system 12 may provide a variable frequency oscillator signal that may be used for frequency translation of an information signal between baseband and a transmit frequency and/or between a receive frequency and baseband.

Within the VCO system 12, a frequency control (i.e., a channel selector) 14 may be used to select a non-coincidental transmit and receive frequency to be used for frequency translation. In a first, receive state, the VCO system 12 provides the receive frequency through a first output 20 to a receiver 16. In a second, transmission state, the VCO system 12 provides a transmit frequency through a second output 22.

Within a receiver portion of the transceiver 10, a signal from the antenna 24 may pass through a transmit/receive switch 26 and be band pass filtered in a first filter 28. The filtered signal may be amplified in an amplifier 30. Following amplification, signal images may be removed within an imaging filter 32. Following bandpass filtering, amplification and image filtering, the information signal may be mixed with the receive frequency from the VCO system 12 in a first mixer 34 and reduced to baseband.

In a transmitter 18 an information signal "IN" is mixed with a transmit signal from the VCO system 12 in a second mixer 40. The mixed signal may be low-pass filtered in a low-pass filter 38. The filtered signal may be amplified in a power amplifier 36 and routed through the transmit/receive switch 26 for transmission through the antenna 24.

Figure 2:
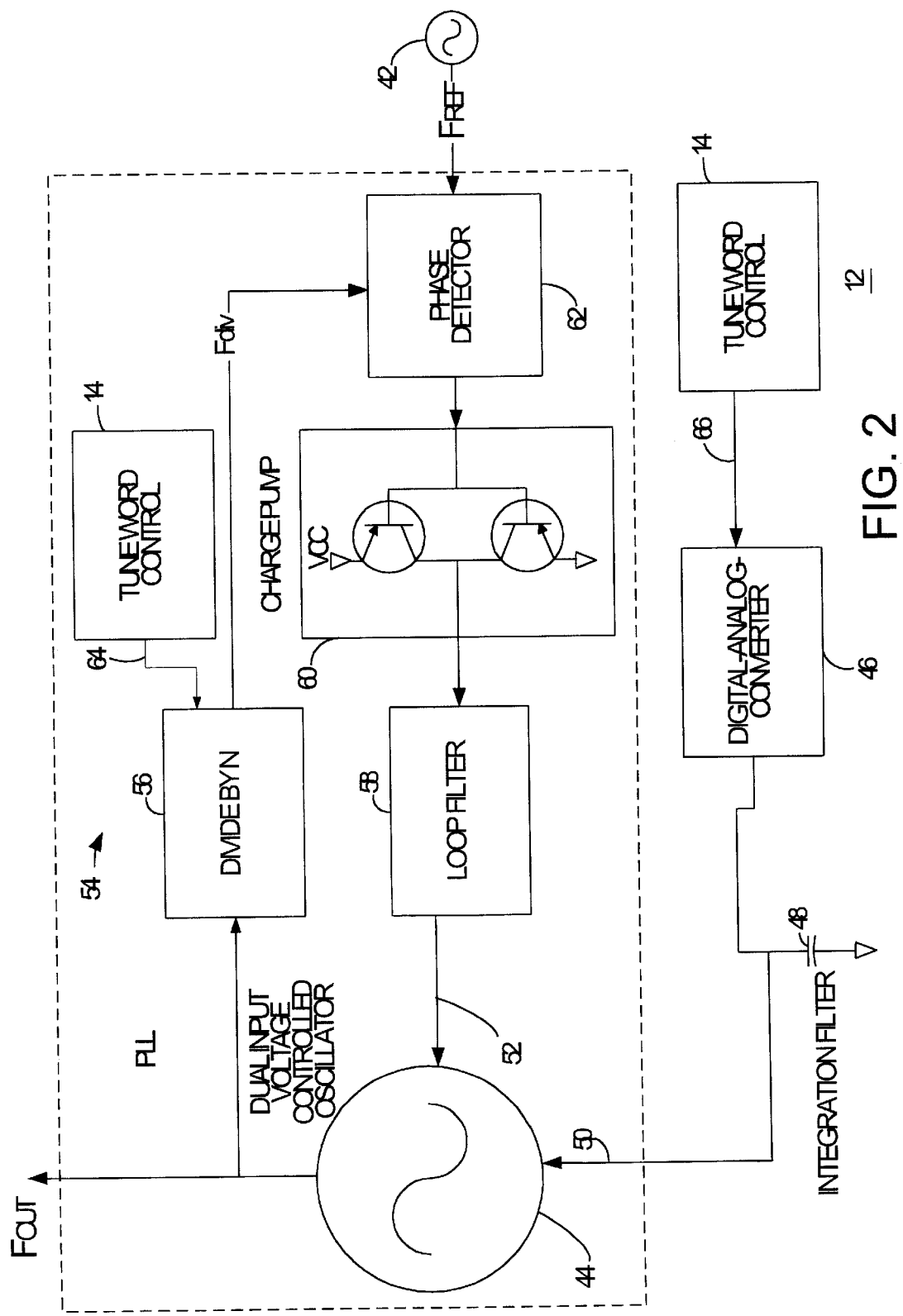
FIG. 2 is a block diagram of the voltage controlled oscillator of FIG. 1.

FIG. 2 is a block diagram of the VCO systems 12 of FIG. 1. The VCO system 12 may be fabricated on a single integrated circuit chip. Included within the VCO system 12 may be a dual-input VCO 44. The dual input VCO 44 may be fabricated using conventional techniques, but with a frequency-controlling varactor diode (not shown) split into first and second sections. A first port 50 (coupled to the first section) may be used to adjust out a processing error of the VCO 44 and center the tuning to a band of interest. A second port 52 (coupled to the second section) may be coupled to a phase-locked loop (PLL) 54 to provide a variable tuning control.

The VCO 44 may receive a first frequency control signal on a first input 50 from the channel selector 14. The channel selector 14 may provide the first frequency control signal under a digital format in the form of a first tune control word 66. A digital to analog (D/A) converter 46 may be provided to convert the tune control word 66 to an analog format. An integration filter 48 may be provided between the D/A converter 46 and VCO 44. The integration filter 48 may be any low pass filter capable of minimizing the noise power spectral density, thereby reducing phase noise and jitter.

A second input 52 of the dual-input VCO 44 may be provided from the PLL 54. An output from the reference oscillator 42 is compared with a divided output frequency $F_{div}$ from the VCO 44 in a phase detector 62. The output frequency from the VCO 44 may be divided to an appropriate comparison frequency for application to the detector 62 within a divider 56. The phase detector 62 may be any electronic device which compares a phase of the divided output frequency $F_{div}$ with the reference frequency $F_{ref}$ and which outputs a control signal(s) proportional to the phase and/or frequency error between the signals.

A second tune control word 64 may be used as the divisor to divide the output frequency $F_{out}$ to the appropriate frequency $F_{div}$. The divider 56 may be conventional or a fractional frequency divider.

From the phase detector 62, the phase difference may be provided as an input to a charge pump 60. The charge pump 60 functions to source or sink current under the control of the phase detector 62. The output of the charge pump 60 is provided as an input to a loop filter 58. The loop filter 58 may be any low pass filter which functions to integrate the pulsed current output of the charge pump 60.

In order to control the VCO system 12 of FIG. 2, a self-calibration routine may be used to create a lookup table of paired tune control words 64 and 66. The paired tune control words may be used for tuning the transceiver 10 of FIG. 1.

For example, loop stability of the VCO system 12 may be inherently determined by the phase and gain margin of the system. To select a set of tune control words 64 and 66, the second tune control word 64 may be chosen (to select a particular operating frequency for the VCO 44) and the first tune control word 66 dithered across some range while monitoring the output voltage of the integration filter 48. A value of the first tune control word 66 is selected as the value which provides a constant product ($k_p * k_v$) of tuning sensitivity ($k_v$) times charge pump current sensitivity ($k_p$). The chosen second control word 64 and selected first control word 66 (which provide a constant ($k_p * k_v$)) are stored as a pair in a lookup table 13 of the tune control circuit 14.

The tuning sensitivity $k_v$ is the change in the output frequency of the VCO 44 per one-volt change of the second tune control word 66 (all other variables held constant). Charge pump sensitivity $k_p$ is the change in the output frequency of the VCO 44 per one-volt change of signal input to the charge pump 60 (again, where all other variables are held constant). Where the first and second tune control words 64 and 66 are chosen such that the product ($k_p * k_v$) is a constant, the linearity of the VCO system 12 is improved considerably.

Once a first pair of tune control words 64 and 66 are determined for a first operating frequency, the second tune control word 64 may be chosen for a second operating frequency. The first tune control word 66 may again be adjusted to find a point of minimum gain and phase margin. The pair values of the first and tune control words 66 and 64 may, again, be stored in the lookup table. The process may be repeated any number of times to fully populate the lookup table 13 over any range of operating frequencies.

The use of the single chip VCO system 12 and first and second tune control words 66 and 64 to control the VCO system 12 offers a number of advantages over prior approaches. For example, independent selection of the first and second tune control words 66 and 64 allows an operating point of the PLL 54 to be centered for maximum stability. The construction of the VCO system 12 on a single chip improves kick and pull performance with regard to power supply fluctuations and parasitic loading effects.

Further, by splitting the VCO control inputs, the overall tuning sensitivity may be improved. The loop filter 58 may be precisely selected for the overall stability of the PLL 54. A smaller bandwidth filter 48 may be selected, which nets a lower phase noise performance for the same overall tuning sensitivity of the VCO system 12.

While various embodiments of the application have been described, it will be apparent to those of ordinary skill in the art that many more embodiments and implementation are possible that are within the scope of this invention. Accordingly, the invention is not to be restricted except in light of the attached claims and their equivalents.

What is claimed is:

1. A method of controlling an output frequency of a dual-input voltage controlled oscillator relative to a reference frequency where the output frequency of the dual-input voltage controlled oscillator may be controlled at any of a plurality of predetermined operating frequencies, such method comprising the steps of:

providing a predetermined first tune control signal and a predetermined second tune control signal for each predetermined frequency of the plurality of predetermined operating frequencies;

selecting a predetermined frequency of the plurality of predetermined operating frequencies;

coupling the predetermined first tune control signal provided for the selected frequency to a first input of the dual-input voltage controlled oscillator;

dividing the output frequency of the dual-input voltage controlled oscillator by a value substantially equal to the predetermined second tune control signal provided for the selected frequency;

comparing a phase of the divided output frequency with a phase of the reference frequency; and coupling a phase difference of the compared phases to a second input of the dual-input voltage controlled oscillator.

2. A method of controlling an output frequency of a dual-input voltage controlled oscillator relative to a reference frequency where the output frequency of the dual-input voltage controlled oscillator may be controlled at any of a plurality of predetermined operating frequencies, such method comprising the steps of:

providing a predetermined first tune control signal and a predetermined second tune control signal for each predetermined frequency of the plurality of predetermined operating frequencies;

selecting a predetermined frequency of the plurality of predetermined operating frequencies;

coupling the first tune control signal provided for the selected frequency as a first numeric value to a first input of the dual-input voltage controlled oscillator;

dividing the output frequency of the dual-input voltage controlled oscillator by a value substantially equal to the second tune control signal provided for the selected frequency as a second numeric value;

comparing a phase of the divided output frequency with a phase of the reference frequency; and coupling a phase difference of the compared phases to a second input of the dual-input voltage controlled oscillator.

3. The method of claim 2 further comprising converting the first numeric value to a voltage for application to the first input.

4. The method of claim 2 wherein the step of dividing the output frequency further comprises dividing by the second numeric value.

5. The method of claim 1 further comprising pumping the phase difference for application to the second input.

6. The method of claim 5 further comprising loop filtering the pumped phase difference.

7. An apparatus for controlling an output frequency of a dual-input voltage controlled oscillator relative to a reference frequency where the output frequency of the dual-input voltage controlled oscillator may be controlled at any of a plurality of predetermined operating frequencies, such apparatus comprising:

means for providing a predetermined first tune control signal and a predetermined second tune control signal for each predetermined frequency of the plurality of predetermined operating frequencies;

means for selecting a predetermined frequency of the plurality of predetermined operating frequencies;

means for coupling the predetermined first tune control signal for the selected frequency to a first input of the dual-input voltage controlled oscillator;

means for dividing the output frequency of the dual-input voltage controlled oscillator by a value substantially equal to the predetermined second tune control signal for the selected frequency;

means for comparing a phase of the divided output frequency with a phase of the reference frequency; and means for coupling a phase difference of the compared phases to a second input of the dual-input voltage controlled oscillator.

8. An apparatus for controlling an output frequency of a dual-input voltage controlled oscillator relative to a reference frequency where the output frequency of the dual-input voltage controlled oscillator may be controlled at any of a plurality of predetermined operating frequencies, such apparatus comprising:

means for providing a predetermined first control signal and a predetermined second tune control signal for each predetermined frequency of the plurality of predetermined operating frequencies;

means for selecting a predetermined frequency of the plurality of predetermined operating frequencies;

means for coupling the first tune control signal provided for the selected frequency as a first numeric value to a first input of the dual-input voltage controlled oscillator;

means for dividing the output frequency of the dual-input voltage controlled oscillator by a value substantially equal to the second tune control signal provided for the selected frequency as a second numeric value;

means for comparing a phase of the divided output frequency with a phase of the reference frequency; and means for coupling a phase difference of the compared phases to a second input of the dual-input voltage controlled oscillator.

9. The apparatus as in claim 8 further comprising means for converting the first numerical value to a voltage for application to the first input.

10. The apparatus as in claim 8 wherein the means for dividing the output frequency further comprises means for dividing by the second numeric value.

11. The apparatus as in claim 7 further comprising means for pumping the phase difference for application to the second input.

12. The apparatus for controlling a frequency of a dual-input voltage controlled oscillator as in claim 11 further comprising means for loop filtering the pumped phase difference.

13. An apparatus for controlling an output frequency of a dual-input voltage controlled oscillator relative to a reference frequency where the output frequency of the dual-input voltage controlled oscillator may be controlled at any of a plurality of predetermined operating frequencies, such apparatus comprising:

a predetermined first tune control signal and a predetermined second tune control signal provided for each predetermined frequency of the plurality of predetermined operating frequencies;

a channel selector adapted to select a predetermined frequency of the plurality of predetermined operating frequencies;

the predetermined first tune control signal for the selected frequency coupled to a first input of the dual-input voltage controlled oscillator;

a frequency divider adapted to divide the output frequency of the dual-input voltage controlled oscillator by a value substantially equal to the predetermined second tune control signal for the selected frequency;

a comparator adapted to compare a phase of the divided output frequency with a phase of the reference frequency; and a phase detector adapted to couple a phase difference of the compared phases to a second input of the dual-input voltage controlled oscillator.

14. An apparatus for controlling an output frequency of a single-chip, dual-input voltage controlled oscillator relative to a reference frequency where the output frequency of the dual-input voltage controlled oscillator may be controlled at any of a plurality of predetermined operating frequencies, such apparatus comprising:

a predetermined first tune control signal and a second predetermined tune control signal provided for each predetermined frequency of the plurality of predetermined operating frequencies;

a channel selector adapted to select a predetermined frequency of the plurality of predetermined operating frequencies;

the first tune control signal for the selected frequency provided as a first numeric value coupled to a first input of the single-chip, dual-input voltage controlled oscillator;

a frequency divider adapted to divide the output frequency of the dual-input voltage controlled oscillator by a value substantially equal to the second tune control signal provided for the selected frequency as a second numeric value;

a comparator adapted to compare a phase of the divided output frequency with a phase of the reference frequency; and a phase detector adapted to couple a phase difference of the compared phases to a second input of the dual-input voltage controlled oscillator.

15. The apparatus as in claim 14 wherein the frequency divider is a divide-by-N divider where N is the second numeric value.

16. The apparatus as in claim 14 further comprising a digital to analog converter adapted to convert the first numeric value to a voltage for application to the first input.

17. An apparatus for controlling an output frequency of a single-chip dual-input voltage controlled oscillator relative to a reference frequency where the output frequency of the dual-input voltage controlled oscillator may be controlled at any of a plurality of predetermined operating frequencies, such apparatus comprising:
- a predetermined first tune control signal and a predetermined second tune control signal provided for each predetermined frequency of the plurality of predetermined operating frequencies;
- a channel selector adapted to select a predetermined frequency of the plurality of predetermined operating frequencies;
- the predetermined first tune control signal for the selected frequency coupled to a first input of the single-chip dual-input voltage controlled oscillator;
- a fractional frequency divider adapted to divide the output frequency of the dual-input voltage controlled oscillator by a value substantially equal to the predetermined second tune control signal for the selected frequency;
- a comparator adapted to compare a phase of the divided output frequency with a phase of the reference frequency; and
- a phase detector adapted to couple a phase difference of the compared phases to a second input of the dual-input voltage controlled oscillator.

18. The apparatus as in claim 13 further comprising a charge pump adapted to pump the phase difference for application to the second input.

19. The apparatus as in claim 18 further comprising a loop filter adapted to filter the pumped phase difference.

20. The method of controlling an output frequency as in claim 1 further comprising selecting the predetermined first and second tune control signals so that a product of a tuning sensitivity and a charge pump current sensitivity equals a constant among the plurality of predetermined operating frequencies.

21. The method of controlling an output frequency as in claim 2 further comprising selecting the predetermined first and second tune control signals so that a product of a tuning sensitivity and a charge pump current sensitivity equals a constant among the plurality of predetermined operating frequencies.

22. The apparatus for controlling an output frequency as in claim 7 further comprising means for selecting the predetermined first and second tune control signals so that a product of a tuning sensitivity and a charge pump current sensitivity equals a constant among the plurality of predetermined operating frequencies.

23. The apparatus for controlling an output frequency as in claim 7 further comprising a lookup table adapted for retrieval of the predetermined first and second tune control signal.

24. The apparatus for controlling an output frequency as in claim 8 further comprising means for selecting the predetermined first and second tune control signals so that a product of a tuning sensitivity and a charge pump current sensitivity equals a constant among the plurality of predetermined operating frequencies.

25. The apparatus for controlling an output frequency as in claim 8 further comprising a lookup table adapted for retrieval of the predetermined first and second tune control signal.

26. The apparatus for controlling an output frequency as in claim 13 further comprising means for selecting the predetermined first and second tune control signals so that a product of a tuning sensitivity and a charge pump current sensitivity equals a constant among the plurality of predetermined operating frequencies.

27. The apparatus for controlling an output frequency as in claim 13 further comprising a lookup table adapted for retrieval of the predetermined first and second tune control signal.

28. The apparatus for controlling an output frequency as in claim 14 further comprising means for selecting the predetermined first and second tune control signals so that a product of a tuning sensitivity and a charge pump current sensitivity equals a constant among the plurality of predetermined operating frequencies.

29. The apparatus for controlling an output frequency as in claim 14 further comprising a lookup table adapted for retrieval of the predetermined first and second tune control signal.

30. The apparatus for controlling an output frequency as in claim 17 further comprising means for selecting the predetermined first and second tune control signals so that a product of a tuning sensitivity and a charge pump current sensitivity equals a constant among the plurality of predetermined operating frequencies.

31. The apparatus for controlling an output frequency as in claim 17 further comprising a lookup table adapted for retrieval of the predetermined first and second tune control signal.

* * * * *